United States Patent
Daughtry et al.

(10) Patent No.: US 6,339,356 B1
(45) Date of Patent: Jan. 15, 2002

(54) VARIABLE ATTENUATOR

(75) Inventors: Earl A. Daughtry; Roy Charles Reese, both of Lawrenceville, GA (US)

(73) Assignee: ADC Telecommunications, Inc.

( * ) Notice: Subject to any disclaimer, the term of this patent is extended or adjusted under 35 U.S.C. 154(b) by 0 days.

(21) Appl. No.: 09/609,076

(22) Filed: Jun. 30, 2000

Related U.S. Application Data

(60) Provisional application No. 60/142,267, filed on Jul. 2, 1999.

(51) Int. Cl.[7] .................................................. H03L 5/00
(52) U.S. Cl. ......................... 327/308; 327/313; 327/314
(58) Field of Search ................................. 327/308, 314, 327/313, 320, 325, 326, 306

(56) References Cited

U.S. PATENT DOCUMENTS

| | | | | |
|---|---|---|---|---|
| 5,521,560 A | * | 5/1996 | Burns et al. ................. | 333/81 |
| 5,592,470 A | | 1/1997 | Rudrapatna et al. | |
| 5,656,978 A | * | 8/1997 | Bianu et al. ................. | 333/81 |
| 5,877,653 A | * | 3/1999 | Kim et al. ................... | 330/149 |
| 6,133,965 A | * | 10/2000 | Dobrovolny ................. | 348/731 |

OTHER PUBLICATIONS

"Siemans Application note on Silicon PIN Diodes", Jul., 1994.

* cited by examiner

Primary Examiner—Toan Tran
Assistant Examiner—Cassandra Cox
(74) Attorney, Agent, or Firm—Fogg, Slifer & Polglaze, P.A.

(57) ABSTRACT

A variable attenuator formed from a combination of PIN diodes is provided. The PIN diodes may be coupled in a "T," "p" or other appropriate configuration. At radio frequencies (RF), a PIN diode acts as a variable resistor with a resistance value based on the bias current of the PIN diode. To control the attenuation level of the variable attenuator, the bias current of the PIN diodes are selectively adjusted. Digital values relating to selected bias currents, and thus selected attenuation levels, are stored in a memory. These digital values are provided as control signals that set the bias current levels for the PIN diodes. The bias current levels control the attenuation level of the variable attenuator.

34 Claims, 3 Drawing Sheets

VARIABLE ATTENUATOR

CROSS REFERENCE TO RELATED APPLICATIONS

This application is related to and claims the benefit of the filing date of co-pending provisional application Serial No. 60/142,267 (the '267 Application), filed on Jul. 2, 1999. The '267 Application is incorporated by reference.

This application is related to the following commonly-assigned, co-pending application:

U.S. application Ser. No. 09/608,360, entitled Network Amplifier With Microprocessor Control, and filed on Jun. 30, 2000, pending.

TECHNICAL FIELD OF THE INVENTION

The present invention relates generally to the field of electronic circuits and, in particular, to a variable attenuator.

BACKGROUND

Coaxial cable networks are a common medium that is used to distribute video and audio programming to consumers with a higher quality than is typically achieved using conventional antennas connected to a television at each user's location. A cable network typically includes a head end that receives inputs or programming from a number of content providers, e.g., ABC, NBC, CBS, Fox, CNN, ESPN, etc. The head end is typically connected to a distribution network that distributes the programming from the head end to, for example, the television sets of a number of subscribers. The distribution network can include coaxial cable alone or in combination with optical fiber, or other distribution medium.

Radio frequency (RF) signals transmitted over a coaxial cable portion of the distribution network tend to attenuate as a function of distance from the head end. This means that the RF signals decrease in quality as they get further away from the head end. To compensate for this attenuation, cable networks typically include network amplifiers that are selectively distributed throughout the network. These amplifiers receive and amplify the RF signals at these selected points in the network such that the signals provided to each end user provide an acceptable level of quality.

A typical network amplifier is formed on a circuit board that is disposed within a housing. The circuit board includes a number of interconnected circuit components that are coupled together to provide, among other things, an RF signal path. The RF signal path is used to controllably amplify RF signals transmitted along the path.

At points in the network amplifier, it may be necessary to reduce the magnitude of the RF signal so that the amplifier amplifies the signal within specified parameters. This is conventionally accomplished through the use of at least one attenuator pad. Attenuator pads are prefabricated devices that plug into a specified location on a circuit board within the amplifier housing. Typically, each attenuator pad provides a preselected, fixed attenuation level. Thus, the amplifier manufacturer determines the desired attenuation level and plugs in an attenuator pad that meets the desired attenuation level.

Once the network amplifier is adjusted, including placement of appropriate attenuator pads, the housing of the network amplifier is sealed and the amplifier is placed into a network. With the amplifier in place, it may become necessary to adjust the attenuator pad. To do this, a technician must go the location of the network amplifier, open the housing and physically remove the original attenuator pad and insert a replacement attenuator pad with an appropriate attenuation value.

For the reasons stated above, and for other reasons stated below which will become apparent to those skilled in the art upon reading and understanding the present specification, there is a need in the art for an attenuator that can more easily be adjusted.

SUMMARY

The above-mentioned problems with attenuators and other problems are addressed by the present invention and will be understood by reading and studying the following specification. A variable attenuator is described which provides a selected attenuation based on a value of at least one digital control signal.

In particular, an illustrative embodiment of the present invention includes a variable attenuator formed from a combination of PIN diodes. The PIN diodes may be coupled in a "pi," "T" or other appropriate configuration. At radio frequencies (RF), a PIN diode acts as a variable resistor with a resistance value based on the bias current of the PIN diode. To control the attenuation level of the variable attenuator, the bias current of the PIN diodes are selectively adjusted. Digital values relating to selected bias currents, and thus selected attenuation levels, are stored in a memory. These digital values are provided as control signals that set the bias current levels for the PIN diodes. The bias current levels control the attenuation level of the variable attenuator.

In another embodiment, the variable attenuator is provided in series with a fixed attenuator. The fixed attenuator can be switchedly bypassed. If the fixed attenuator provides the same attenuation level as the maximum level for the variable attenuator, the combination of the fixed and variable attenuators can provide up to twice as much attenuation as the variable attenuator working alone.

DETAILED DESCRIPTION

The following detailed description refers to the accompanying drawings which form a part of the specification. The drawings show, and the detailed description describes, by way of illustration specific illustrative embodiments in which the invention may be practiced. These embodiments are described in sufficient detail to enable those skilled in the art to practice the invention. Other embodiments may be used and logical, mechanical and electrical changes may be made without departing from the scope of the present invention. The following detailed description is, therefore, not to be taken in a limiting sense.

I. Variable Attenuator

Figure 1:
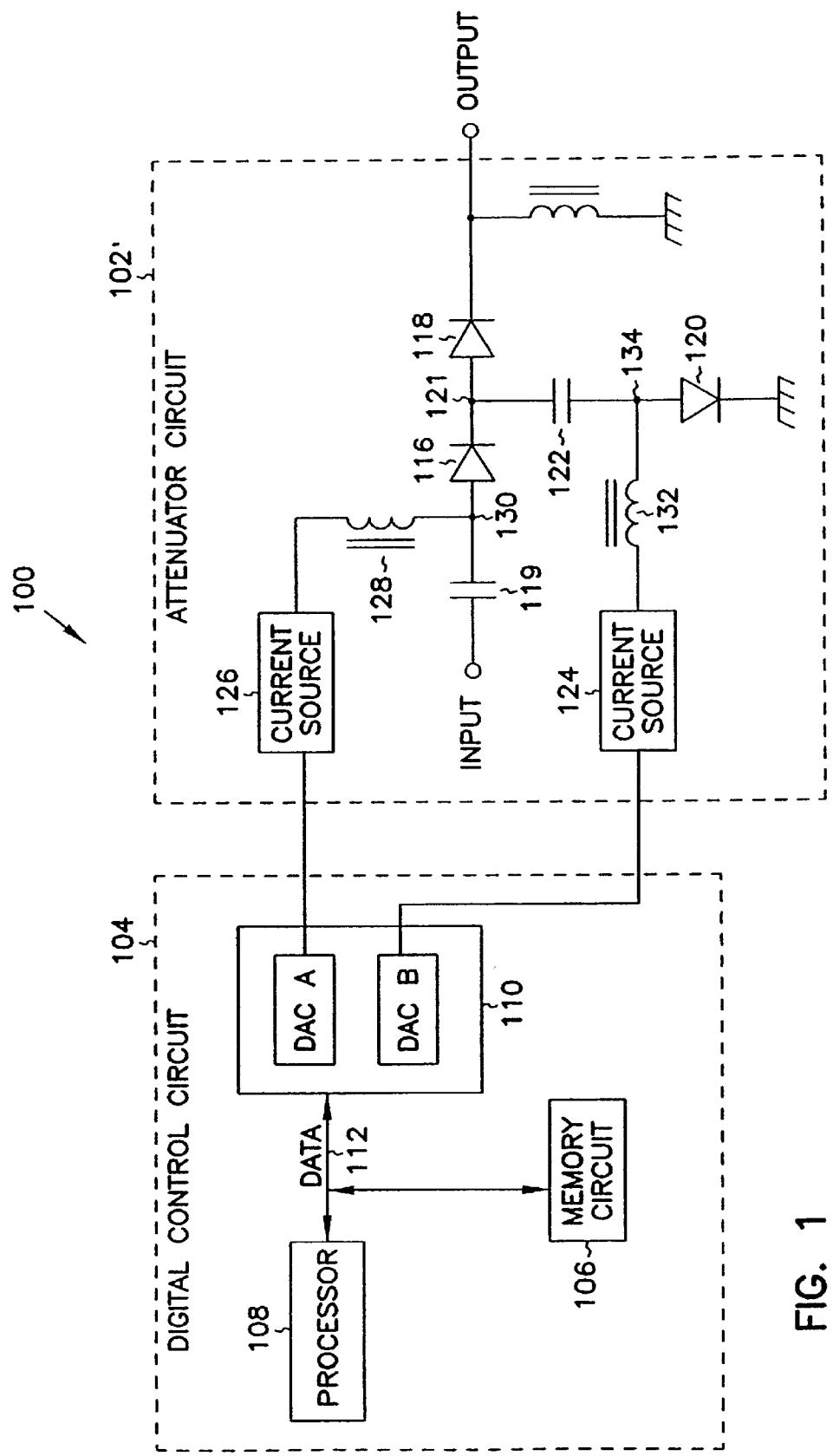
FIG. 1 is a schematic diagram of an embodiment of a variable attenuator constructed according to the teachings of the present invention.

FIG. 1 is a schematic diagram of an embodiment of a variable attenuator indicated generally at 100 and constructed according to the teachings of the present invention. Attenuator 100 includes attenuator circuit 102 and digital control circuit 104. Digital control circuit 104 provides digital control signals to attenuator circuit 102. The digital control signals set the current in a number of PIN diodes of attenuator circuit 102. By setting the current in the PIN diodes, the attenuation level of attenuator circuit 102 is also established. Advantageously, by incorporating digital control circuit 104 into variable attenuator 100, the attenuation level provided to a signal path of an electronic system, e.g., network amplifier of a cable network, can be adjusted without the removal and replacement of an attenuation pad. Further, the attenuation level can be adjusted without the need to open the housing of the electronic system, e.g., network amplifier.

A. Digital Control Circuit

In one embodiment, digital control circuit 104 uses values stored in a memory circuit to control the attenuation level of variable attenuator 100. Digital control circuit 104 includes memory circuit 106, processor 108, and digital to analog converter (DAC) chip 110. Memory circuit 106, processor 108, and DAC chip 110 are coupled to data bus 112.

In the embodiment shown, DAC chip 110 includes first and second digital to analog converters (DACs) labeled DAC A and DAC B in FIG. 1. DAC A and DAC B each provide a control signal to attenuator circuit 102.

In one embodiment, memory circuit 106 is implemented as a non-volatile memory, such as an EEPROM, EPROM, Flash memory or other appropriate memory circuit. Memory circuit 106 stores a table of attenuation values and associated control signals for DAC A and DAC B that are used by attenuator circuit 102 to provide a selected attenuation level. For example, the table may include control signals for attenuation levels from 0.25 dB to 10 dB in 0.25 dB steps. It is understood that control signals for other attenuation levels can be stored in memory circuit 106 as needed for a specific application.

Processor 108 controls the flow of data from digital control circuit 104 to attenuator circuit 102.

B. Attenuator Circuit

Figure 2:
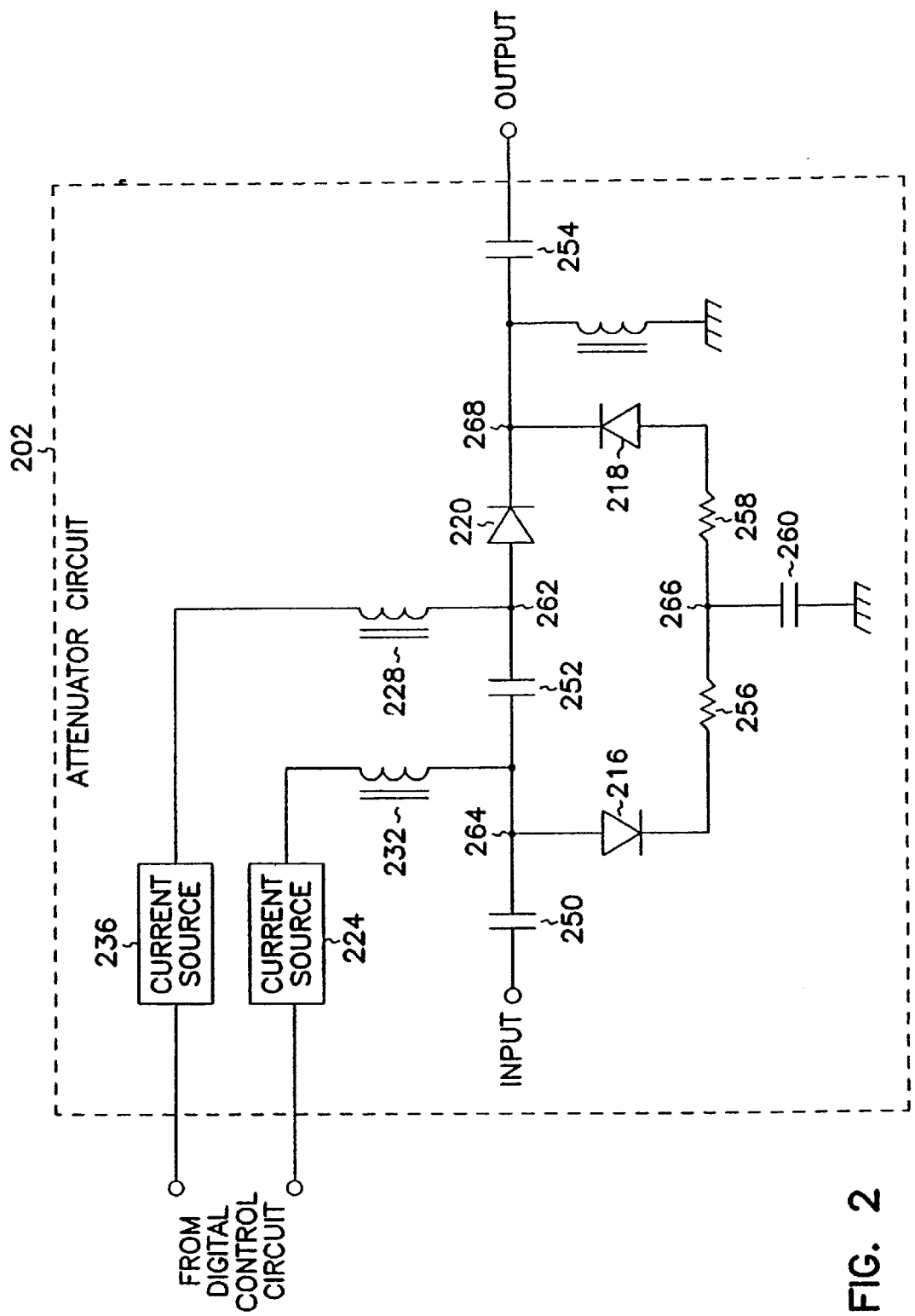
FIG. 2 is a schematic diagram of an alternative embodiment of an attenuator circuit constructed according to the teachings of the present invention.

Attenuator circuit 102 attenuates signals on a signal path using PIN diodes 116, 118, and 120. In FIG. 1, PIN diodes 116, 118 and 120 are coupled in a "T" configuration. PIN diodes are used in attenuator circuit 102 since, at radio frequencies (RF), a PIN diode acts as a variable resistor with a resistance value based on its bias current. It is noted that the PIN diodes can also be coupled in a "pi" configuration as shown in FIG. 2.

In the embodiment of FIG. 1, diodes 116 and 118 and capacitor 119 are coupled in series between INPUT and OUTPUT nodes of the signal path of attenuator circuit 102. Diode 120 is coupled in series with capacitor 122 between node 121 and ground.

Attenuator circuit 102 includes first and second current sources 124 and 126 to receive the control signals from digital control circuit 104. Current source 126 is coupled through RF choke 128 to node 130 between capacitor 119 and PIN diode 116. Current source 124 is coupled through RF choke 132 to node 134 between capacitor 122 and PIN diode 120. Current sources 124 and 126 provide currents that are controlled by the voltage of the signals from DAC A and DAC B, respectively.

C. Operation

In operation, digital control circuit 104 provides control signals to attenuator circuit 102 to establish a selected attenuation level for variable attenuator 100. To select a desired attenuation level, processor 108 looks in the look up table stored in memory circuit 106 to find the digital control signals associated with the desired attenuation level. Memory 106 places these values on data bus 112. DAC A and DAC B receive these values from data bus 112 and convert the digital signals to analog control signals with specified voltage levels.

Attenuator circuit 102 receives these analog control signals at current sources 124 and 126. Current source 124 converts its control signal to establish a bias current for PIN diode 120. Current source 126 converts its control signal to establish a bias current for PIN diodes 116 and 118. The bias currents establish the resistance of PIN diodes 116, 118, and 120 and thus establish the attenuation level of variable attenuator 100. The attenuation level can be changed at anytime by reading different digital control signals from memory 106 and applying the control signals to attenuator circuit 102 through DAC chip 110.

If an attenuation level is selected that is not found in the memory 106, then processor 108 uses interpolation to generate digital control signals for DAC chip 110. For example, processor 108 retrieves the digital control signals associated with the two closest attenuation values stored in memory 106 and performs a linear interpolation to establish control signals provided to DAC chip 110.

II. Alternative Embodiment of an Attenuator Circuit

FIG. 2 is a schematic diagram of an alternative embodiment of an attenuator circuit, indicated generally at 202, constructed according to the teachings of the present invention. As described above, attenuator circuit 202 is based on PIN diodes 216, 218, and 220 that are coupled in a "pi" configuration.

In the embodiment of FIG. 2, diode 220 and capacitors 250, 252, and 254 are coupled in series between INPUT and OUTPUT nodes of the signal path of attenuator circuit 202. Diodes 216 and 218 are coupled in series with resistors 256 and 258 between nodes 264 and 268. Capacitor 260 is coupled between node 266 and ground.

Attenuator circuit 202 includes current sources 224 and 236. Current sources 224 and 236 are coupled to a digital control circuit such as, for example, digital control circuit 104 of FIG. 1. It is understood that the digital control circuit can take on other configurations so long as the digital control circuit provides signals to attenuator circuit 202 that establish bias currents in PIN diodes 216, 218, and 220 to set a selected attenuation level. Current source 236 is coupled through RF choke 228 to node 262. Current source 224 is coupled through RF choke 232 to node 264.

III. Alternative Embodiment of a Variable Attenuator

Figure 3:
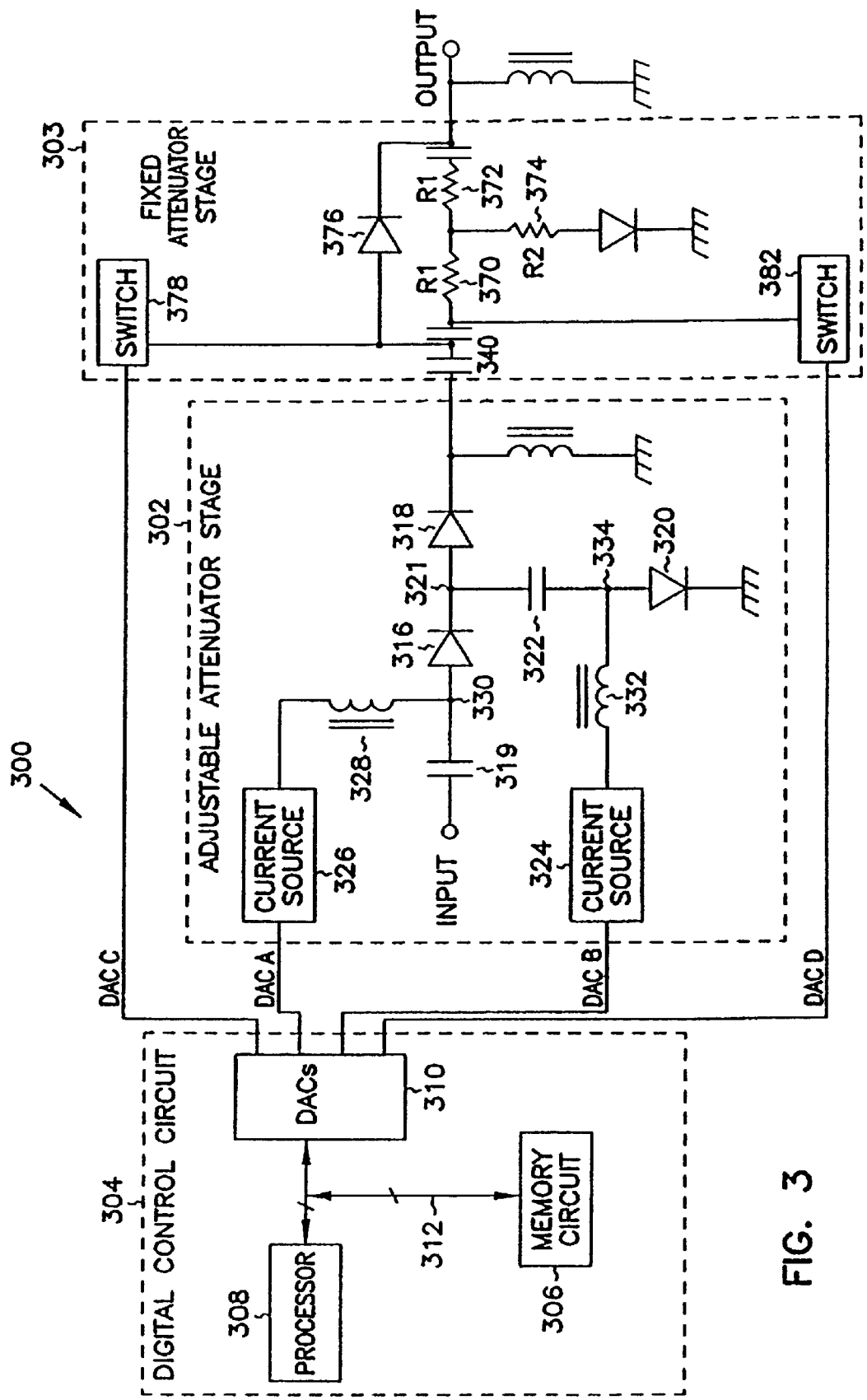
FIG. 3 is a schematic diagram of another embodiment of a variable attenuator constructed according to the teachings of the present invention.

FIG. 3 is a schematic diagram of another embodiment of a variable attenuator, indicated generally at 300, constructed according to the teachings of the present invention. Attenuator 300 includes digital control circuit 304, adjustable attenuator stage 302 and fixed attenuator stage 303. Digital control circuit 304 provides digital control signals to adjustable attenuator stage 302. The digital control signals set the current in a number of PIN diodes of adjustable attenuator stage 302. By setting the current in the PIN diodes, the attenuation level of adjustable attenuator stage 302 is also established. Fixed attenuator stage 303 is also provided on the signal path between INPUT and OUTPUT nodes. Fixed attenuator stage 303 is selectively switched into or out of the signal path. When fixed attenuator stage 303 is switched into the signal path, its fixed attenuation level is added to the attenuation level provided by adjustable attenuator stage 302. Thereby, fixed attenuator stage 303 can be used to increase the range of attenuation levels provided by variable attenuator 300.

Advantageously, by incorporating digital control circuit 304 into variable attenuator 300, the attenuation level provided to a signal path of an electronic system, e.g., network amplifier of a cable network, can be adjusted without the removal and replacement of an attenuation pad. Further, the attenuation level can be adjusted without the need to open the housing of the electronic system, e.g., network amplifier. The range of variable attenuator 300 is double the range of adjustable attenuator stage 302 by including fixed attenuator stage 303. For example, if adjustable attenuator stage 302 is programmed to provide attenuation levels from 0.25 dB to 8 dB in 0.25 dB steps and fixed attenuator stage 303 provides an attenuation level of 8 dB when switched into the path, then variable attenuator 300 can provide an attenuation level between 0.25 and 16 dB in 0.25 dB steps.

A. Digital Control Circuit

In one embodiment, digital control circuit 304 uses values stored in a memory circuit to control the attenuation level of variable attenuator 300. Digital control circuit 304 includes memory circuit 306, processor 308, and digital to analog converter (DAC) chip 310. Memory circuit 306, processor 308, and DAC chip 310 are coupled to data bus 312.

In the embodiment shown, DAC chip 310 includes first and second digital to analog converters with outputs labeled DAC A and DAC B in FIG. 3. DAC A and DAC B each provide a control signal to adjustable attenuator stage 302. DAC chip 310 also includes digital to analog converters with outputs labeled DAC C and DAC D that are used to control the switching in of fixed attenuator stage 303.

In one embodiment, memory circuit 306 is implemented as a non-volatile memory, such as an EEPROM, EPROM, Flash memory or other appropriate memory circuit.

Memory circuit 306 stores a table of attenuation values and associated control signals for DACs A, B, C, and D. The values provided to DACs A and B are used by adjustable attenuator stage 302 to provide a selected attenuation level. For example, the table may include control signals for attenuation levels from 0.25 dB to 8 dB in 0.25 dB steps. It is understood that control signals for other attenuation levels can be stored in memory circuit 306 as needed for a specific application. This table can be generated using the technique described above with respect to FIG. 4. Further, the values provided to DACs C and D are used by fixed attenuator stage 303 to determine whether the fixed attenuator stage is to be switched into the signal path.

Processor 308 controls the flow of data from digital control circuit 304 to adjustable attenuator stage 302.

B. Attenuator Circuit

Adjustable attenuator stage 302 attenuates signals on a signal path using PIN diodes 316, 318, and 320. In FIG. 3, PIN diodes 316, 318 and 320 are coupled in a "T" configuration. PIN diodes are used in adjustable attenuator stage 302 since, at radio frequencies (RF), a PIN diode acts as a variable resistor with a resistance value based on its bias current. It is noted that the PIN diodes can also be coupled in a "pi" configuration as shown and described with respect to FIG. 2 above.

In the embodiment of FIG. 3, diodes 316 and 318 and capacitor 319 are coupled in series between INPUT node and node 340 of the signal path of adjustable attenuator stage 302. Diode 320 is coupled in series with capacitor 322 between node 321 and ground.

Adjustable attenuator stage 302 includes first and second current sources 324 and 326 that receive the control signals from digital control circuit 304. Current source 326 is coupled through RF choke 328 to node 330 between capacitor 319 and PIN diode 316. Current source 324 is coupled through RF choke 332 to node 334 between capacitor 322 and PIN diode 320. Current sources 324 and 326 provide currents that are controlled by the voltage of the signals from DAC A and DAC B, respectively.

C. Fixed Attenuator Stage

Fixed attenuator stage 303 is provided to increase the range of variable attenuator 300. Fixed attenuator stage 303 includes resistors 370, 372 and 374 coupled in a "T" configuration to provide a fixed attenuation to be added to the attenuation level of adjustable attenuator stage 302 in the signal path between INPUT and OUTPUT nodes of variable attenuator 300.

The affect of fixed attenuator stage 303 on the attenuation level of variable attenuator 300 can be bypassed. Fixed attenuator stage 303 includes switches 378 and 382 that are coupled to receive control signals from digital control circuit 304. These control signals, labeled DAC C and DAC D, respectively, control switches 378 and 382 to selectively bypass resistors 370, 372 and 374. When bypassed, fixed attenuator stage 303 provides no attenuation on signals passing between the INPUT and OUTPUT nodes of variable attenuator 300. When not bypassed, fixed attenuator stage 303 adds a fixed attenuation level set by resistors 370, 372, and 374.

Fixed attenuator stage 303 provides, in one embodiment, a fixed attenuation level that is equal to the maximum attenuation level of adjustable attenuator stage 302. This approximately doubles the range of the attenuation level for variable attenuator 300. For example, if adjustable attenuator stage 302 can provide attenuation levels in the range from 0.25 dB to 8 dB in 0.25 dB steps, then the attenuation level of fixed attenuator stage 303 can be set at 8 dB. In this embodiment, variable attenuator 300 can provide attenuation levels in the range from 0.25 dB to 16 dB with 0.25 dB steps. To accomplish this, fixed attenuator stage 303 is bypassed for all attenuation levels below 8 dB. For attenuation levels above 8 dB, fixed attenuator stage 303 provides 8 dB of attenuation and adjustable attenuator stage 302 provides the remaining attenuation necessary to establish a selected attenuation level. The settings for adjustable attenuation stage 302 and fixed attenuation stage 303 are controlled by digital control circuit 304 based on digital control signals stored in memory 306.

D. Operation

In operation, digital control circuit 304 provides control signals to adjustable attenuator stage 302 and fixed attenuator stage 303 to establish a selected attenuation level for variable attenuator 300. To select a desired attenuation level, processor 308 looks in the look up table stored in memory circuit 306 to find the digital control signals associated with the desired attenuation level. Memory 306 places these values on data bus 312. DACs 310 receive digital signals from data bus 312 and convert the digital signals to analog control signals with specified voltage levels to control the attenuation level of adjustable attenuation stage 302 via signals DAC A and DAC B. DACs 310 also receive digital signals from data bus 312 and convert the digital signals to analog control signals with specified voltage levels to selectively bypass fixed attenuation stage 302 via signals DAC C and DAC D.

Adjustable attenuator stage 302 receives the DAC A and DAC B control signals at current sources 326 and 324. Current source 324 converts its control signal to establish a bias current for PIN diode 320. Current source 326 converts its control signal to establish a bias current for PIN diodes 316 and 318. The bias currents establish the resistance of PIN diodes 316, 318, and 320 and thus establish the attenuation level of adjustable attenuator stage 302. The attenuation level can be changed at anytime by reading different digital control signals from memory 306 and applying the control signals to adjustable attenuator stage 302 through DAC chip 310.

Fixed attenuator stage 303 receives control signals DAC C and DAC D at switches 378 and 382, respectively. Based on these control signals, the effect of resistors 370, 372, and 374 on the signal path can be effectively bypassed. Alternatively, resistors 370, 372, and 374 can add to the attenuation level provided by adjustable attenuator stage 302.

It is noted that interpolation can also be used with this embodiment to achieve attenuation levels not stored in memory 306.

Conclusion

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the digital control circuit can take on other configurations that provide control signals to establish selected bias current levels in PIN diodes of an attenuator circuit. The memory circuit, DACs and processor described above can be replaced with other circuitry that stores and selectively delivers control signals to set the attenuation level of an attenuator circuit. The range of attenuation levels provided by the various stages and circuits can be adjusted as necessary for a particular application. The range of 0.25 dB to 8.0 dB with 0.25 dB steps is provided by way of example and not by way of limitation.

What is claimed is:

1. A variable attenuator comprising:
   an attenuator circuit having a signal path; and
   a control circuit coupled to provide control signals to the attenuator circuit based on data stored in a memory circuit to establish a selected attenuation for the signal path of the variable attenuator, wherein the attenuator circuit comprises at least two current sources coupled to receive the control signals from the control circuit to establish bias current in selected PIN diodes of the attenuator.

2. The variable attenuator of claim 1, wherein the attenuator circuit further comprises an RF choke in series with each current source.

3. A variable attenuator comprising:
   an attenuator circuit having a signal path;
   a control circuit coupled to provide control signals to the attenuator circuit based on data stored in a memory circuit to establish a selected attenuation for the signal path of the variable attenuator; and
   a fixed attenuator stage bypassably coupled in series with the attenuator circuit.

4. The variable attenuator of claim 3, wherein the fixed attenuator stage provides an attenuation level that is substantially the same as the highest attenuation level of the attenuator circuit.

5. A variable attenuator, comprising:
   an adjustable attenuator stage including at least three PIN diodes coupled to provide attenuation in a signal path of the variable attenuator;
   a fixed attenuator stage bypassedly coupled in series with the signal path of the adjustable attenuator stage; and
   a control circuit coupled to provide control signals to the adjustable attenuator stage and the fixed attenuator stage so as to select an attenuation level for the variable attenuator.

6. The variable attenuator of claim 5, wherein the at least three PIN diodes are coupled in a "pi" configuration.

7. The variable attenuator of claim 5, wherein the at least three PIN diodes are coupled in a "T" configuration.

8. The variable attenuator of claim 5, wherein the control circuit includes a memory circuit that stores a look-up table with control signals.

9. The variable attenuator of claim 5, wherein the look-up table includes control signals for the adjustable attenuator stage and the fixed attenuator stage that are associated with selectable attenuation levels.

10. The variable attenuator of claim 5, wherein the control circuit further comprises:
    a processor;
    at least one digital to analog converter; and
    a bus that interconnects the processor, the memory, and the digital to analog converter such that the processor selects digital control signals from the memory, the memory places the selected digital control signals on the bus, and the digital to analog converter converts the digital control signals to control signals for the adjustable attenuator stage.

11. The variable attenuator of claim 5, wherein the adjustable attenuator stage comprises at least two current sources coupled to receive the control signals from the control circuit to establish bias current in selected PIN diodes of the attenuator.

12. The variable attenuator of claim 11, wherein the attenuator circuit further comprises an RF choke in series with each current source.

13. A variable attenuator, comprising:
    a control circuit including:
       a look-up table that stores digital control signals for associated attenuation levels, and
       at least one digital to analog converter for converting digital control
    signals from the look-up table to analog voltages; and
       an attenuator circuit including:
          at least three PIN diodes coupled to provide attenuation in a signal path, and
          at least two current sources that are coupled to provide first and second bias current levels to the PIN diodes based on the analog voltages from the control circuit to establish a selected attenuation level.

14. The variable attenuator of claim 13, wherein the control circuit includes a memory circuit that stores the look-up table.

15. The variable attenuator of claim 13, wherein the at least three PIN diodes are coupled in a "T" configuration.

16. The variable attenuator of claim 13, wherein the at least three PIN diodes are coupled in a "pi" configuration.

17. The variable attenuator of claim 13, and further including a fixed attenuator stage bypassably coupled in series with the attenuator circuit.

18. The variable attenuator of claim 14, wherein the fixed attenuator stage provides an attenuation level that is substantially the same as the highest attenuation level of the attenuator circuit.

19. A method for establishing an attenuation level in a signal path of an electronic circuit, the method comprising:

receiving a signal that indicates a selected attenuation level;

accessing digital control signals that correspond to the selected attenuation level;

converting the digital control signals to analog voltages;

driving at least two current sources with the analog voltages; and providing the output of the at least two current sources to PIN diodes to establish the selected attenuation level in the signal path.

20. The method of claim 19, wherein accessing a digital control signal comprises accessing a look-up table.

21. The method of claim 19, wherein providing the output of the at least two current sources to PIN diodes comprises providing the output of the at least two current sources to PIN diodes coupled in a "T" configuration.

22. The method of claim 19, wherein providing the output of the at least two current sources to PIN diodes comprises providing the output of the at least two current sources to PIN diodes coupled in a "pi" configuration.

23. The variable attenuator of claim 1, wherein the attenuator circuit comprises at least three PIN diodes coupled in a "pi" configuration.

24. The variable attenuator of claim 1, wherein the attenuator circuit comprises at least three PIN diodes coupled in a "T" configuration.

25. The variable attenuator of claim 1, wherein the control circuit comprises a look-up table with digital control signals for a plurality of attenuation levels stored in the memory circuit.

26. The variable attenuator of claim 25, wherein the control circuit further comprises:

a processor;

at least one digital to analog converter; and a bus that interconnects the processor, the memory, and the digital to analog converter such that the processor selects digital control signals from the memory, the memory places the selected digital control signals on the bus, and the digital to analog converter converts the digital control signals to control signals for the attenuator circuit.

27. The variable attenuator of claim 26, wherein the at least one digital to analog converter comprises two digital to analog converters.

28. The variable attenuator of claim 1, and further including a fixed attenuator stage bypassably coupled in series with the attenuator circuit.

29. The variable attenuator of claim 28, wherein the fixed attenuator stage provides an attenuation level that is substantially the same as the highest attenuation level of the attenuator circuit.

30. The variable attenuator of claim 3, wherein the attenuator circuit comprises at least three PIN diodes coupled in a "pi" configuration.

31. The variable attenuator of claim 3, wherein the attenuator circuit comprises at least three PIN diodes coupled in a "T" configuration.

32. The variable attenuator of claim 3, wherein the control circuit comprises a look-up table with digital control signals for a plurality of attenuation levels stored in the memory circuit.

33. The variable attenuator of claim 32, wherein the control circuit further comprises:

a processor;

at least one digital to analog converter; and a bus that interconnects the processor, the memory, and the digital to analog converter such that the processor selects digital control signals from the memory, the memory places the selected digital control signals on the bus, and the digital to analog converter converts the digital control signals to control signals for the attenuator circuit.

34. The variable attenuator of claim 33, wherein the at least one digital to analog converter comprises two digital to analog converters.

\* \* \* \* \*